United States Patent
Zhou

(10) Patent No.: US 9,467,118 B2
(45) Date of Patent: Oct. 11, 2016

(54) RFID POSITIONING AND TRACKING APPARATUS AND METHODS

(71) Applicant: Liming Zhou, San Jose, CA (US)

(72) Inventor: Liming Zhou, San Jose, CA (US)

(*) Notice: Subject to any disclaimer, the term of this patent is extended or adjusted under 35 U.S.C. 154(b) by 0 days.

(21) Appl. No.: 14/516,585

(22) Filed: Oct. 17, 2014

(65) Prior Publication Data

US 2015/0108210 A1    Apr. 23, 2015

Related U.S. Application Data

(60) Provisional application No. 61/893,217, filed on Oct. 19, 2013.

(51) Int. Cl.
| | |
|---|---|
| G06F 17/00 | (2006.01) |
| H03H 11/24 | (2006.01) |
| H04W 4/02 | (2009.01) |
| H03K 19/00 | (2006.01) |
| H03F 1/02 | (2006.01) |
| G06K 7/10 | (2006.01) |
| H03H 7/18 | (2006.01) |
| H03H 7/24 | (2006.01) |
| H03H 7/25 | (2006.01) |
| H03F 3/195 | (2006.01) |
| H03F 3/24 | (2006.01) |
| G06K 19/077 | (2006.01) |
| G01S 5/02 | (2010.01) |

(Continued)

(52) U.S. Cl.
CPC ........... *H03H 11/245* (2013.01); *G01S 5/0247* (2013.01); *G01S 5/08* (2013.01); *G06K 7/10237* (2013.01); *G06K 7/10356* (2013.01); *G06K 19/07749* (2013.01); *G06K 19/07773* (2013.01); *H03F 1/02* (2013.01); *H03F 1/0211* (2013.01); *H03F 3/195* (2013.01); *H03F 3/245* (2013.01); *H03H 7/18* (2013.01); *H03H 7/24* (2013.01); *H03H 7/255* (2013.01); *H03K 19/0005* (2013.01); *H04W 4/02* (2013.01); *H03F 2200/102* (2013.01); *H03F 2200/105* (2013.01); *H03F 2200/27* (2013.01); *H03F 2200/321* (2013.01); *H03F 2200/336* (2013.01); *H03F 2200/414* (2013.01); *H03H 7/383* (2013.01)

(58) Field of Classification Search
CPC .. G08G 5/0021; G06Q 30/02; G06Q 20/341; G07F 7/1008
USPC ...................... 235/375, 380; 343/893; 701/14
See application file for complete search history.

(56) References Cited

U.S. PATENT DOCUMENTS

| | | |
|---|---|---|
| 3,685,050 A | 8/1972 | Cartwright |
| 4,963,887 A | 10/1990 | Kawashima et al. |
| 6,229,992 B1 | 5/2001 | McGeehan et al. |

(Continued)

*Primary Examiner* — Karl D Frech
(74) *Attorney, Agent, or Firm* — Jun Liu

(57) ABSTRACT

Technologies for RFID positioning and tracking apparatus and methods are disclosed herein. The apparatus and methods disclose a radio-frequency identification positioning system that includes a radio-frequency identification reader and a phased-array antenna coupled to the radio-frequency identification reader. Techniques are applied to reduce in-reader and in-antenna signal leakages. Techniques are applied to position and track RFID tags. Circuits with leakage cancellation abilities are also disclosed. Reflective vector attenuators with tunable impedance load are also disclosed. Polarization adjustable antennas with matching circuits used in the RFID positioning system are also disclosed. Circuits to re-transmit a received signal at a higher amplitude to enhance radio link range are also disclosed. Techniques are applied to increase the level of scattered radio signals from RFID tags.

19 Claims, 18 Drawing Sheets

RFID reader positioning system using phased-array reader and programmable RFID tags.

(51) Int. Cl.
  *G01S 5/08* (2006.01)
  *H03H 7/38* (2006.01)

(56) References Cited

U.S. PATENT DOCUMENTS

| | | |
|---|---|---|
| 6,838,989 B1 | 1/2005 | Mays et al. |
| 7,180,402 B2 | 2/2007 | Carrender et al. |
| 8,386,111 B2 | 2/2013 | Cox et al. |
| 8,410,905 B2 | 4/2013 | Song et al. |
| 8,823,577 B2 | 9/2014 | Smid et al. |
| 9,024,839 B2* | 5/2015 | Schneider ................. 343/893 |
| 2007/0206704 A1 | 9/2007 | Zhou et al. |
| 2009/0085741 A1 | 4/2009 | Ravi et al. |
| 2014/0081483 A1* | 3/2014 | Weinmann ........... G08G 5/0021 701/14 |

* cited by examiner

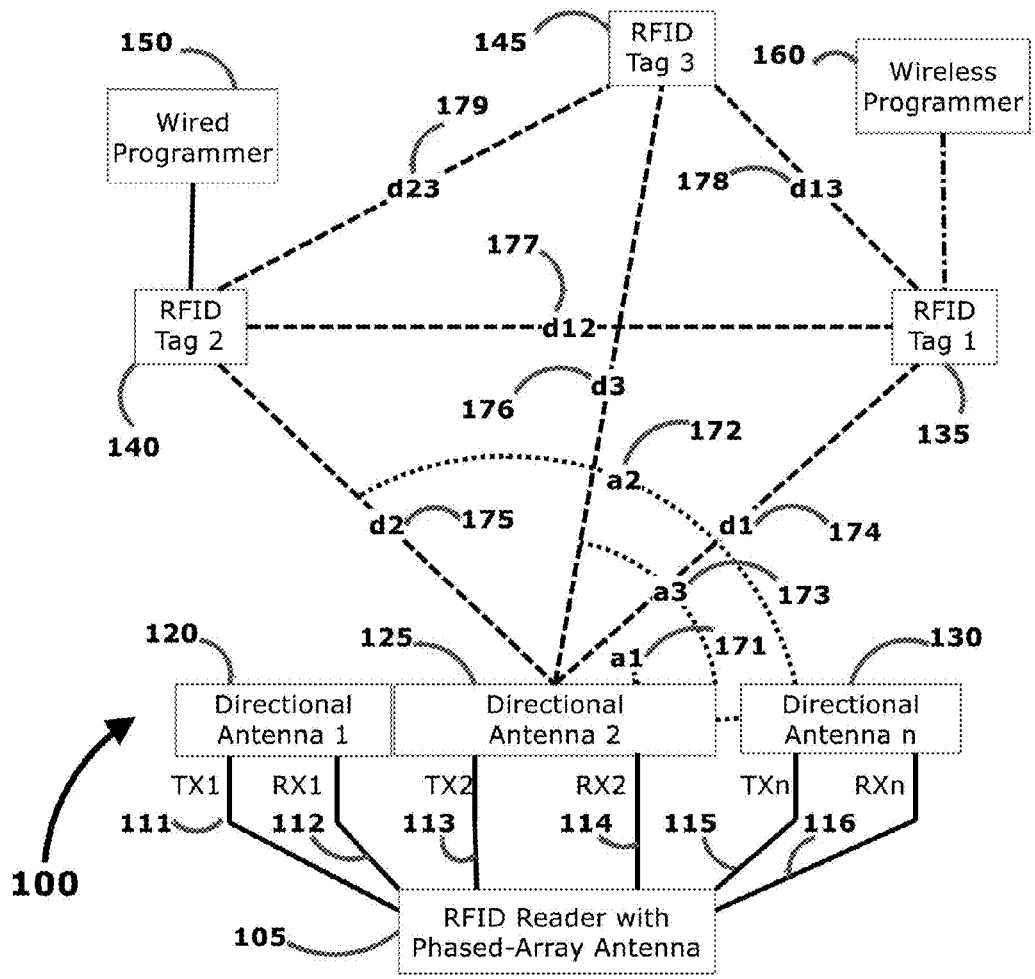
FIG 1. RFID reader positioning system using phased-array reader and programmable RFID tags.

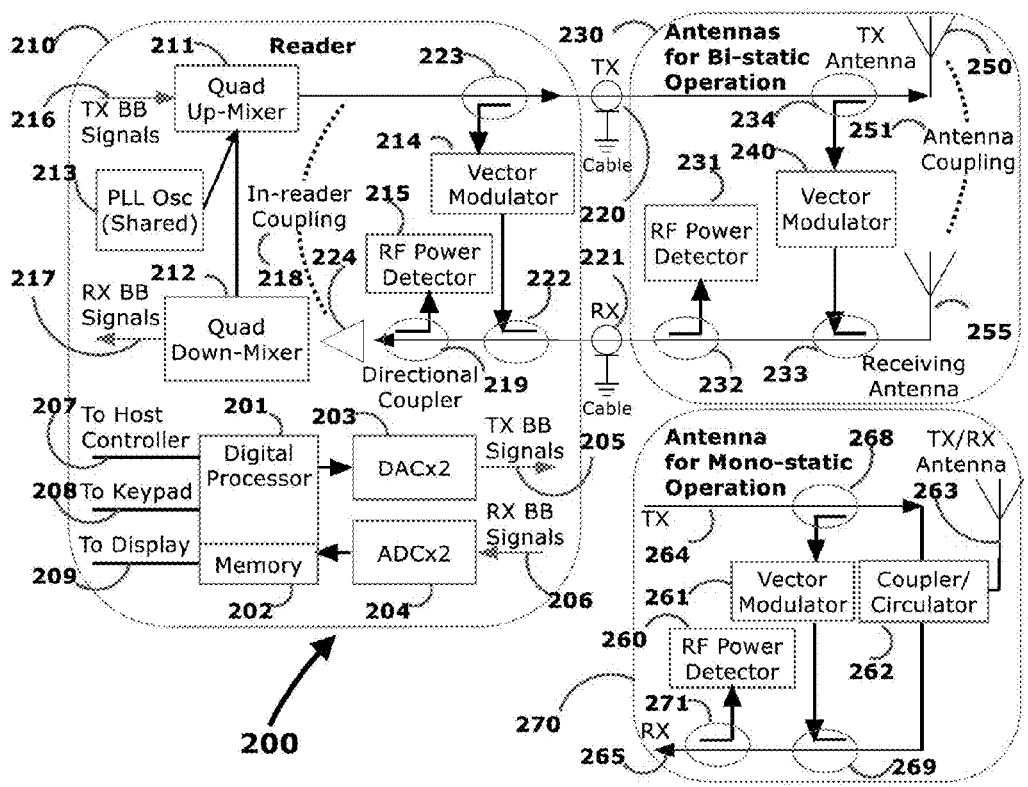
FIG. 2A. RFID reader structures with in-reader and in-antenna transmission leakage cancellers.

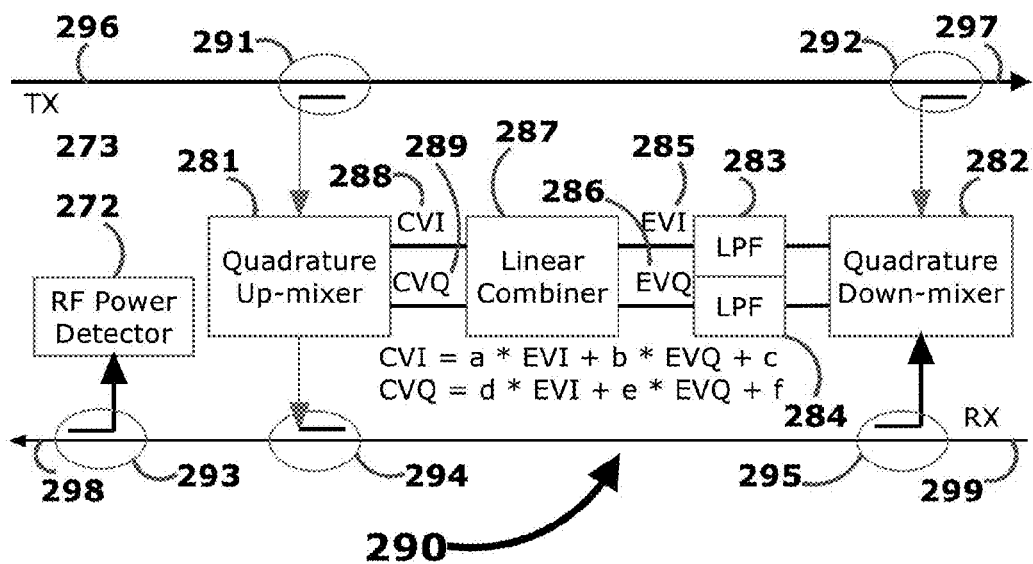
FIG. 2B. Feed-forward transmission leakage canceller.

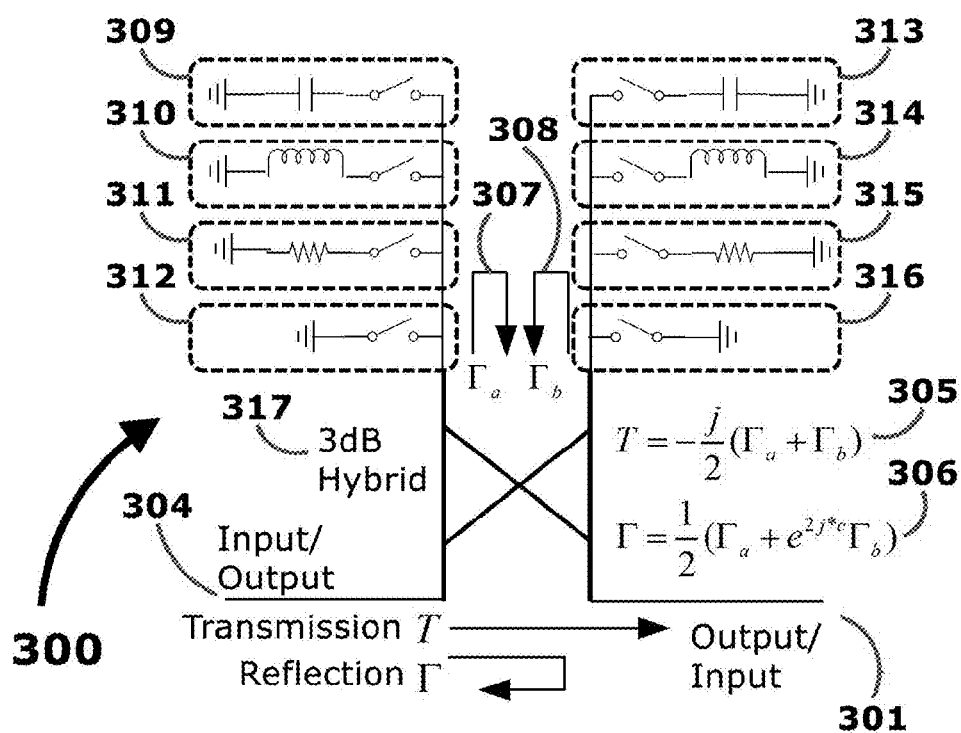
FIG. 3A. Reflective vector attenuator with switchable LRC terminations.

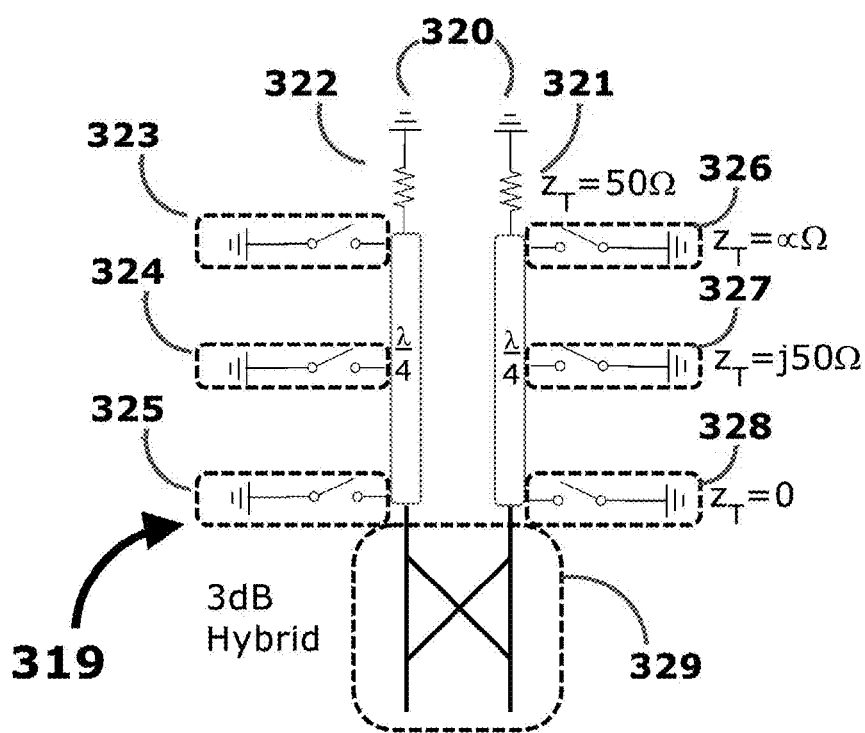
FIG 3B. Reflective vector attenuator with shunt-switch-loaded transmission lines.

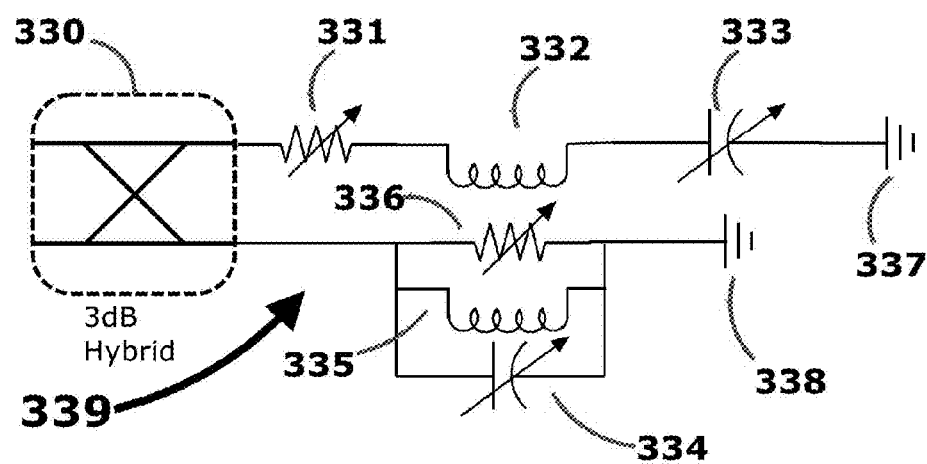
FIG. 3C. Reflective vector attenuator with series and shunt tunable LRC terminations.

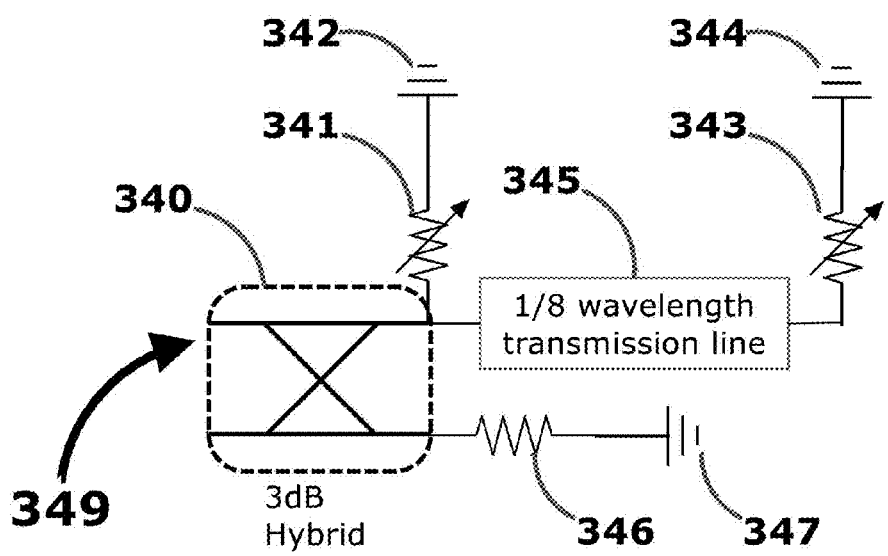
FIG. 3D. Reflective vector attenuator with a double variable-resistor-loaded transmission line.

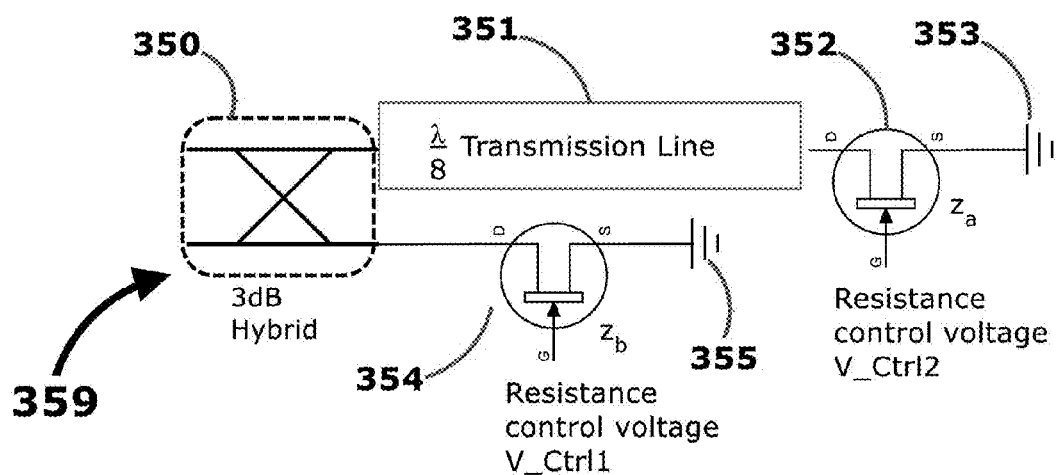
FIG. 3E. Reflective vector attenuator with phase-delayed variable resistors.

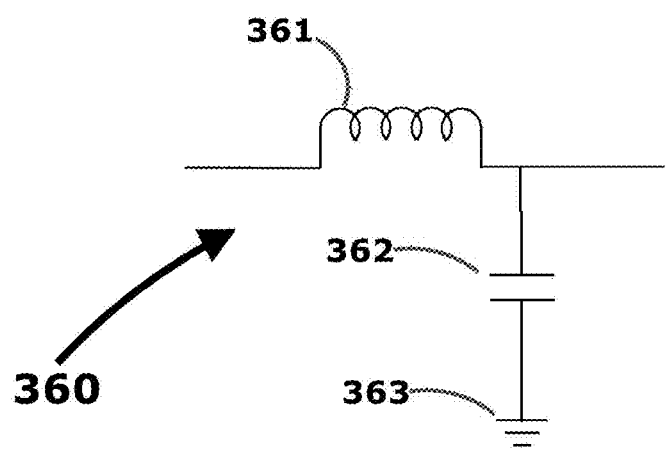
FIG. 3F, phase delay circuit to replace 1/8 wavelength transmission line

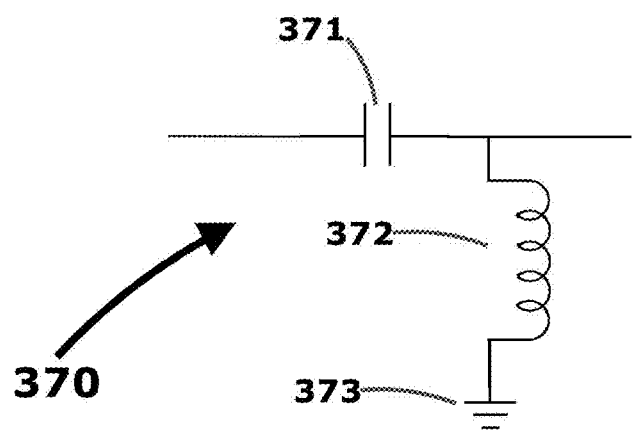
FIG. 3G, circuit to replace 1/8 wavelength transmission line with negative delay.

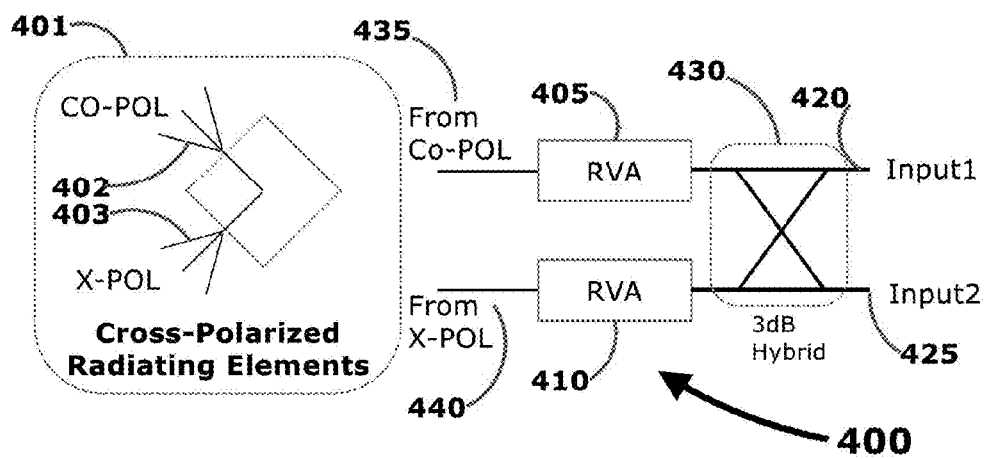
FIG. 4A. Dual adjustable polarized antenna with controllable polarization correlations.

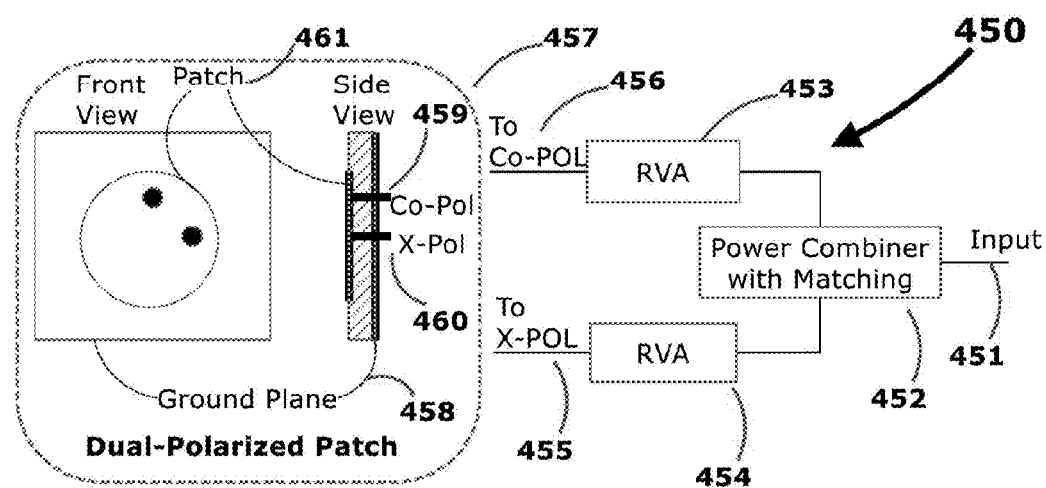
FIG. 4B. Polarization adjustable antenna with matching circuits.

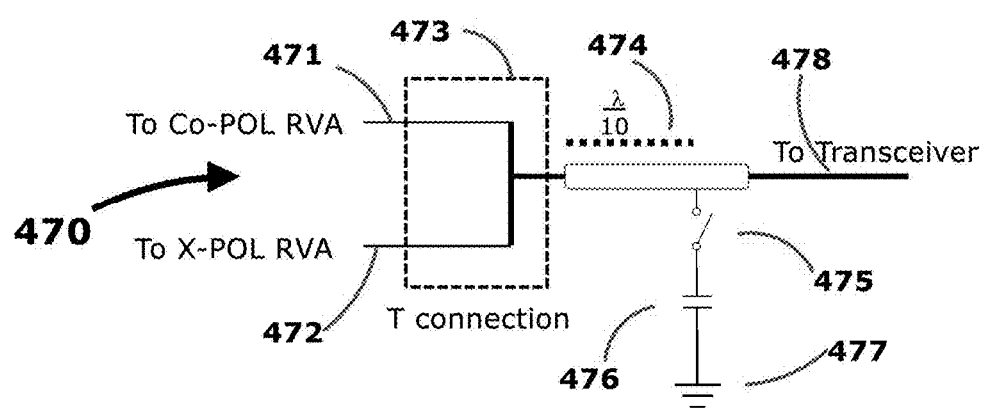
FIG. 4C. Stubbed matching circuit for a 25/50 ohm variable load

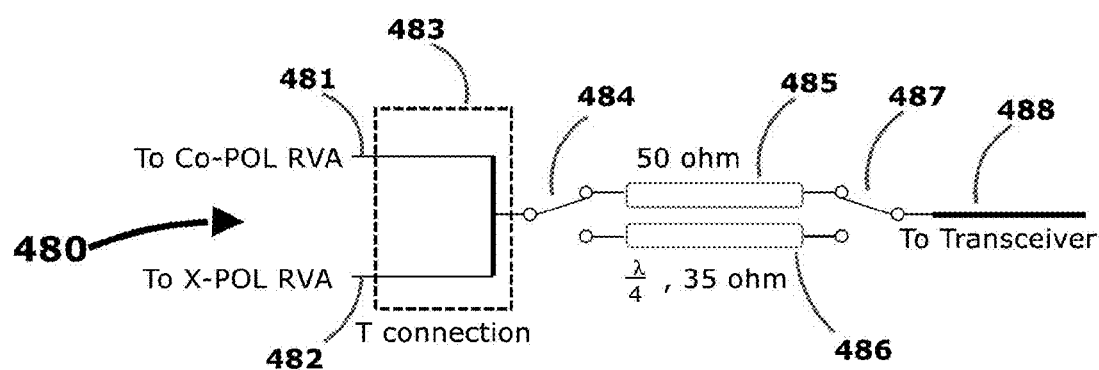
FIG. 4D. Branch selective matching circuit for a 25/50 ohm variable load

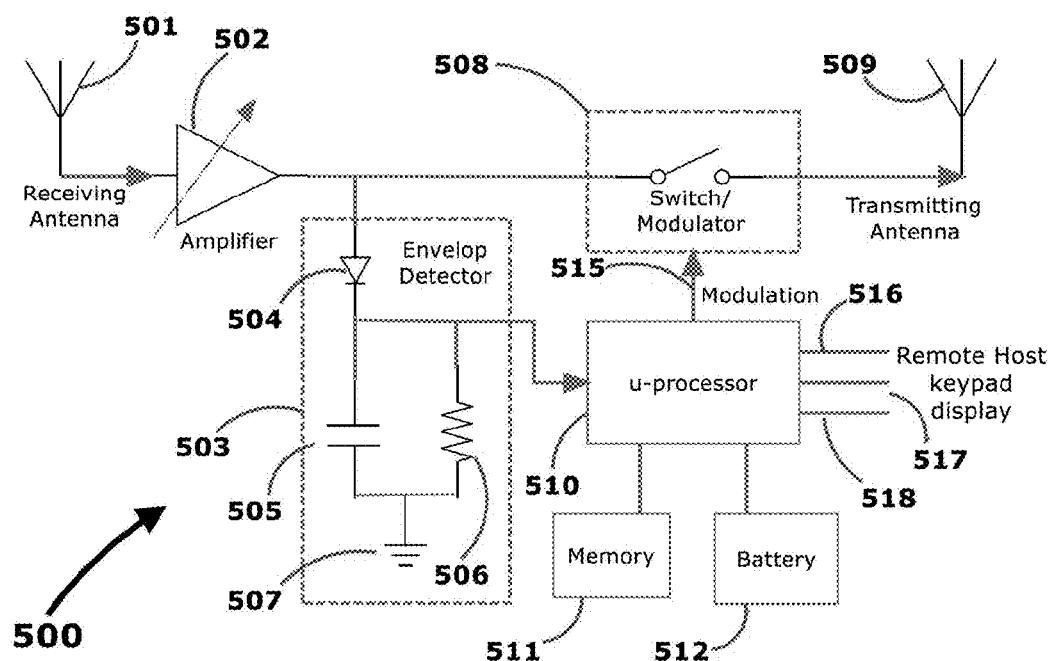
FIG. 5A. Cross-polarized bi-static RFID tag with amplifier and switch modulator

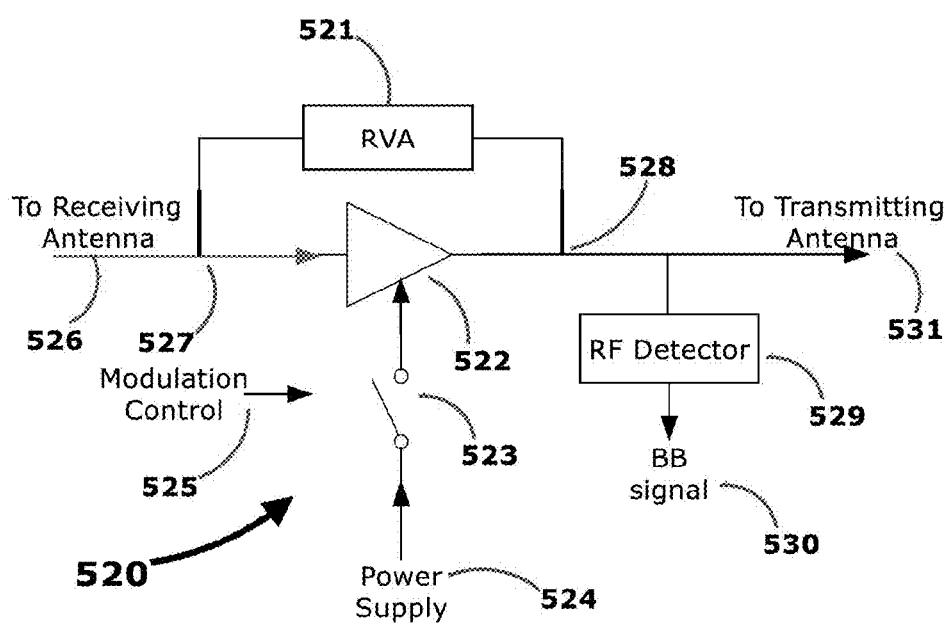
FIG. 5B. Bi-static RFID tag with amplifier modulator and leakage canceller for stability control and modulation depth enhancement

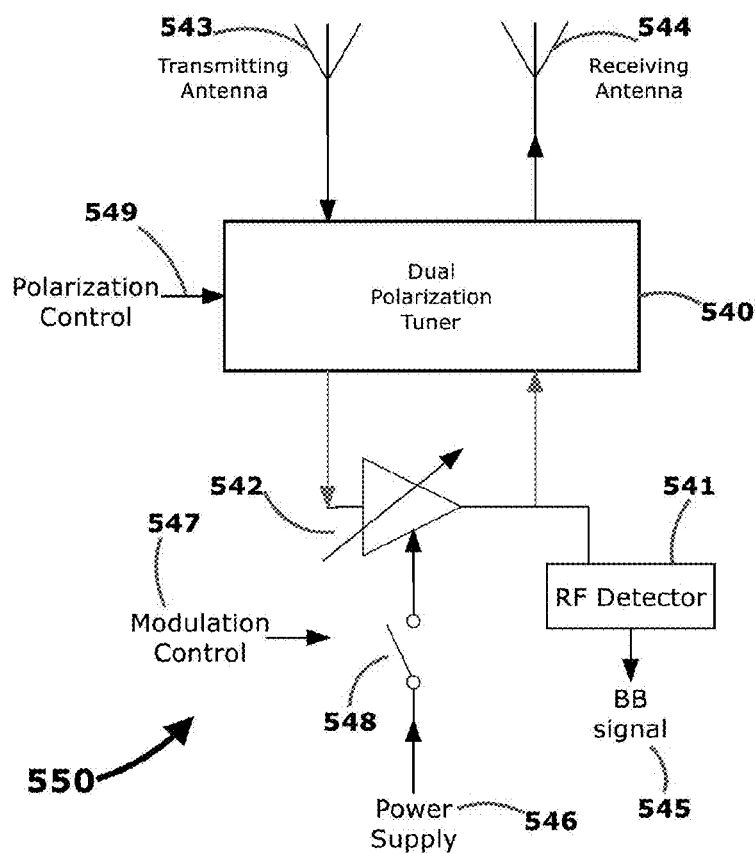
FIG. 5C. Bi-static RFID tag with polarization control to enhance stability and improve reception sensitivity.

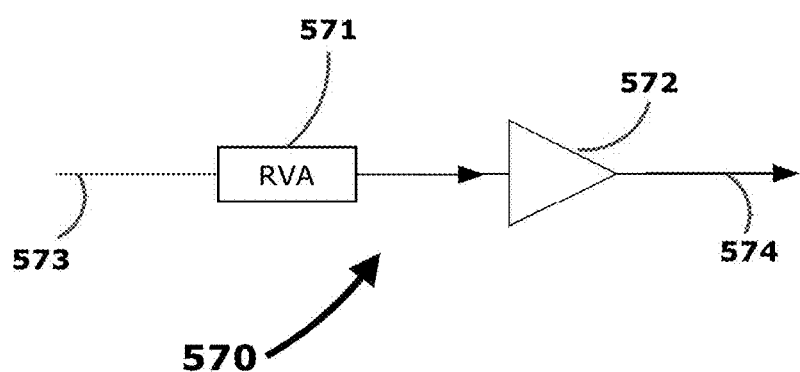
FIG. 5D. Amplifier with adjustable gain and phase

RFID POSITIONING AND TRACKING APPARATUS AND METHODS

PRIORITY CLAIM

This application is a non-provisional utility patent application that claims the benefit of U.S. Provisional Patent Application No. 61/893,217, entitled "RFID Positioning and Tracking Apparatus and Methods", which was filed on Oct. 19, 2013, all of which are incorporated by reference herein in its entirety.

FIELD OF THE INVENTION

At least one embodiment of the present invention pertains to radio-frequency identification systems to position and track stationary and moving objects. At least one embodiment of the present invention further pertains to signal leakage canceling in radio-frequency identification system.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Radio-frequency (RF) identification (RFID) is the wireless use of electromagnetic fields to transfer data, for the purposes of automatically identifying, detecting, positioning and tracking tags.

In some cases, RFID systems comprise RFID tags and readers. RF readers comprise an antenna and electronic power circuitry to locate nearby tags and receive encoded information using radio frequency communication. The reader emits high frequency radio waves that any nearby passive RF tag, which absorbs radio energy to power-up its own integrated circuit or load-modulate the radio energy to beam back an ID number to the reader. The reader can also write basic information to the chip on the tag. For example, if the RF tag is inside a book, a code written to the chip may indicate the book has been checked out. A security gate reader will then receive this information from the tag to allow the book to pass through.

Many models of reader are hand-held devices (resembling a barcode scanner or pricing gun), but they can also be fixed in place (such as in security gates or counter-tops) or even hidden completely (embedded in ceilings or walls).

A typical RFID tag consists of a microchip attached to a radio antenna mounted on a substrate. The microchip can store information such as vehicle license plate or payment related information. RFID tags, which use radio waves to communicate their identity and other information to nearby readers, can be passive or active. Passive RFID tags are powered by the reader and do not have a battery. Active RFID tags are powered by batteries and able to generate own radio signal.

RFID tags can store a range of information from one serial number to several pages of data. Readers can be mobile so that they can be carried by hand, or they can be mounted on a post or overhead. Reader systems can also be built into the architecture of a cabinet, room, or building.

These radio-frequency identification tags can be attached to objects such as vehicles, persons and other movable objects. The radio-frequency tags contain electronically stored information and may be accessed or programmed wirelessly by RFID readers in a distance.

SUMMARY

Techniques introduced here provide a feed-forward and open-loop leakage cancellation circuit which includes a quadrature down-mixer configured to down-mix a first copy of a receiver signal with a first copy of a transmitter signal and generate two outputs. The circuit also includes a first low pass filter coupled to the in-phase output of the down-mixer and the first low pass filter is configured to filter the output and generate a first reference voltage. The circuit includes a second low pass filter coupled to the quadrature output of the down-mixer and the second low pass filter is configured to filter the output and generate a second reference voltage. The circuit also includes a linear combiner coupled to the first low pass filter and the second low pass filter. The linear combiner is configured to generate a first control voltage and a second control voltage. The first control voltage is related to a first linear combination of the first reference voltage, the second reference voltage and a first coefficient. The second control voltage is related to a second linear combination of the first reference voltage, the second reference voltage and a second coefficient. The circuit includes a quadrature up-mixer coupled to the linear combiner. The quadrature up-mixer is configured to up-mix the first control voltage, the second control voltage and a second copy of the transmitter signal. The quadrature up-mixer is configured to add output of the up-mixer back to receiving signal and cancel transmitter leakage.

Techniques introduced here also provide a radio-frequency identification positioning system that includes a radio-frequency identification reader and a phased-array antenna coupled to the radio-frequency identification reader. The phased-array antenna is configured to contain at least two radiating elements and capable of obtaining angle of arrival information and location information of at least two radio-frequency identification tags. The at least two radio-frequency identification tags are configured to store the location information. Each of the at least two radiating elements is driven by a dedicated radio frequency up-converter for transmission and each of the at least two radiating elements is driven by a dedicated radio frequency down-converter for reception. Phase delays between the at least two radiating elements are configured to create radiation peaks at different azimuth or elevation angles to estimate direction of the at least two radio-frequency identification tags and identify the location of the reader.

Techniques introduced here also provide a reflective vector attenuator that includes a hybrid coupler that comprises a first 3 dB port and a second 3 dB port. The attenuator also includes a first termination circuit coupled to the first 3 dB port and the first termination circuit is configured to have a first adjustable termination impedance. The attenuator also includes a second termination circuit coupled to the second 3 dB port and the second termination circuit is configured to have either a second adjustable termination impedance or a fixed impedance.

Techniques introduced here provided a feed-back and closed-loop leakage cancellation circuits which includes a quadrature down-mixer configured to mix a receiver signal with either a copy of a transmitter signal or a local oscillator signal and generate two outputs. The circuit also includes a first low pass filter coupled to the quadrature down-mixer and the first low pass filter is configured to filter the one output of the mixer and generate a first reference voltage. The circuit includes a second low pass filter coupled to the quadrature down-mixer and the second low pass filter is configured to filter the one output of the mixer and generate a second reference voltage. The circuit also includes a linear combiner coupled to the first low pass filter and the second low pass filter. The linear combiner is configured to generate a first control voltage and a second control voltage. One configuration of the linear combiner includes two analog to digital converters to digitize the reference voltages; a digital signal processor unit to linearly process the converted voltage; and two digital to analog converters to produce two control signals. Another configuration of the linear combiner includes four analog multipliers and two analog signal combiners to produce two control signals. The circuit includes a vector attenuator coupled to the linear combiner. The vector attenuator is controlled by the two control signals to produce a negative copy of the transmission leakage. The produced negative leakage is combined back to the receiving signal before the quadrature mixer to cancel the transmission leakage into the mixer. An amplifier may be inserted between the leakage combiner and quadrature down-mixer to reduce the noise figure of the down-converter. Two high pass filters or bandpass filters are individually coupled to the in-phase and quadrature outputs of the down-mixer to further reduce transmitter leakage from the down-converted receiving signals for demodulation.

Techniques introduced here also provide a radio frequency identification tag that comprises a receiving antenna and the receiving antenna is configured to receive external signals. The radio frequency identification tag also includes an amplifier coupled to the receiving antenna and the amplifier is configured to amplify the external signals and generate amplified signals. The tag also includes an envelope detector coupled to the amplifier, wherein the envelop detector is configured to demodulate the amplified signals from the amplifier and generate demodulated signals. The tag also includes a processor coupled to the envelop detector and the processor is configured to process the demodulated signals to initiate activities including but not limiting to reading or writing memory, generate processed signals, interface with an input or output device, or communicate with a remote host. The tag also includes a single-pole-single-throw switch coupled to the amplifier and the processor and the switch is controlled by the processor to amplitude modulate the amplified signal to generate modulated messages. The tag also includes a transmitting antenna coupled to the switch and the transmitting antenna is configured to broadcast the modulated messages. The tag also includes a memory unit coupled to the processor and the memory unit is configured to store information. One configuration of the tag contains a vector attenuator coupled to the amplifier and the retransmitted signal may be phase or frequency modulated by the vector attenuator.

Techniques include here also provide a radio relay device that includes a receiving antenna, an amplifier coupled to the receiving antenna, and a transmitting antenna to re-transmit the received signal at a higher amplitude. The relay device further includes a envelop detector coupled to the amplifier, to compare the output power level to a pre-determined level to identify the operating condition of the amplifier. The gain or phase of the amplifier may be further tuned to either suppress oscillation or to keep the amplifier operating linearly.

Other aspects of the technology introduced here will be apparent from the accompanying figures and from the detailed description which follows.

BRIEF DESCRIPTION OF THE DRAWINGS

These and other objects, features and characteristics of the present invention will become more apparent to those skilled in the art from a study of the following detailed description in conjunction with the appended claims and drawings, all of which form a part of this specification. In the drawings:

FIG. 1 illustrates a diagram of a radio-frequency identification (RFID) positioning system.

FIG. 2A illustrates a diagram of RFID reader structures with in-reader and in-antenna transmission leakage cancellers.

FIG. 2B illustrates a diagram of a feed-forward transmission leakage canceller.

FIG. 3A illustrates a diagram of a reflective vector attenuator with switchable LRC terminations.

FIG. 3B illustrates a diagram of a reflective vector attenuator with shunt-switch-loaded transmission lines.

FIG. 3C illustrates a diagram of a reflective vector attenuator with series and shunt tunable LRC terminations.

FIG. 3D illustrates a diagram of a reflective vector attenuator with a double variable-resistor-loaded transmission line.

FIG. 3E illustrates a diagram of a reflective vector attenuator with phase-delayed variable resistors.

FIG. 3F illustrates a diagram of a phase delay circuit to replace ⅛ wavelength transmission line FIG. 3G illustrates a diagram of a circuit to replace ⅛ wavelength transmission line with negative delay.

FIG. 4A illustrates a diagram of a dual adjustable polarized antenna with controllable polarization correlations.

FIG. 4B illustrates a diagram of a polarization adjustable antenna with matching circuits.

FIG. 4C illustrates a diagram of a stubbed matching circuit for a 25/50 ohm variable load.

FIG. 4D illustrates a diagram of a branch selective matching circuit for a 25/50 ohm variable load.

FIG. 5A illustrates a diagram of a bi-static RFID tag with amplifier and switch modulator.

FIG. 5B illustrates a diagram of a bi-static RFID tag with amplifier modulator and vector attenuator for stability control and modulation depth enhancement FIG. 5C illustrates a diagram of a bi-static RFID tag with polarization control.

FIG. 5D illustrates a diagram of an amplifier with adjustable gain and phase.

DETAILED DESCRIPTION

References in this specification to "an embodiment," "one embodiment," or the like, mean that the particular feature, structure, or characteristic being described is included in at least one embodiment of the present invention. Occurrences of such phrases in this specification do not all necessarily refer to the same embodiment, however.

In the modern world, RFID tags and readers are used in the daily life for access control and asset management. However, utilization of RFID systems including RFID reader and tags are limited. Some limiting factors include the multi-path wave propagation effect, limited activation power threshold due to transistor threshold, and less than unity of back-scattering modulation efficiency for existing passive and semi-passive RFID tags. Back-scattering modulated RFID tags required the reader to operating in the full-duplex mode, which is simultaneous operation of the transmitter and receiver. The RFID reader receiver has a variable noise figure subject to potential de-sensitization by its transmission leakage. A breakthrough in reader sensitivity and tag modulation efficiency would greatly increases read distances of RFID tags, and opens the door to a whole host of applications. Applications that were not realizable at the moment would be achievable with doubled or quadrupled read distances.

Most RFID tags may be divided into two parts. A first part includes an integrated circuit for storing and processing information, modulating and demodulating a radio-frequency (RF) signal, and other specialized functions. A second part includes an antenna for receiving the signal. Passive RFID tag uses one antenna for transmit and receiving, at the same time, and the back-scattering modulation is performed by changing the load impedance of the antenna. The back-scattered signal is only a portion of the incoming signal, and some energy is used to power-up the internal circuits of passive RFID tags. An amplifier and a circulator may be added to a single-antenna back-scattering tag to increase modulation efficiency. Such approach has a high risk of oscillation due to antenna impedance variation. A loop is formed by the amplifier and circulator lines. The change of antenna impedance and return loss is directly contributed to the loop gain, and the loop amplifier will oscillate if the loop gain is one or higher for this ring. It will be appreciated to have a more reliable way to utilize amplifier in RFID tags to enhance the modulation efficiency.

There are three general types of RFID tags: active RFID tags, which contain a battery and can transmit signals autonomously; passive RFID tags, which have no battery and require an external wave source to power-up the tag circuits and to be provoked for tag signal transmission; and battery assisted passive (BAP) or semi-active tags which require an external source to power-up the tag circuit but external wave source as the RF source is still required to be load modulated for tag signal transmission. In general, battery assisted passive tags have lower RF triggering power, and a longer reader range. However, the longer read range required better RFID reader sensitivity due to higher propagation loss.

An RFID reader/receiver can transmit RF waves to nearby RFID tags for information exchange. Tag read range is determined by the reader transmission power, propagation loss, polarization match between the reader and tag, and tag activation power threshold. In a real environment there are multiple propagation paths exist between the reader and tag. As the tag moves around, the combined wave from the multiple paths would leads to variable field strength, and the combined wave polarization axial ratio and orientation will change. A strong fading effect will be observed on fixed transmitting and receiving antenna polarizations. The reader need to have sensitivity lower than the back-scattered tag response, which could be very low for long range tags even in free space environment. The reader sensitivity is determined by its noise figure and dynamic range, and level of de-sensing by transmission leakage. The tag activation distance may be achieved by increasing the transmission power or decreasing the tag activation power. The first method leads to a stronger de-sensing transmission leakage, and the second method leads to more path-loss. Either method could benefit from a reader with less leakage.

In full-duplex of RFID systems the leakage of transmission signal may occur in the reader, between the transmitting and receiving antenna, or bounced off the surrounding environment. The in-reader leakage is introduced by internal PCB coupling, power coupling, wave resonance, device leakage, or proximity coupling. The antenna-introduced coupling would be return-loss dependent in mono-static setup, or mutual coupling dependent in bi-static setup. Mono-static means that one antenna is responsible for simultaneous transmission and receiving, and bi-static means that two antennas are individually responsible for transmission and receiving. A circulator or directional coupler is commonly used to duplex the transmission and reception in a mono-static radio. Additionally, environmental change such as a vehicle or human being approaching or departure from the antenna would also introduce transmission leakage. These three types of leakage require multiple solutions, and the antenna introduced leakages require much faster tracking for cancellation. An existing leakage canceller approach utilize a combination of variable attenuator and phase shifter to modulate a copy of transmission signal to produce a negative copy of transmission leakage. However, the existing reflective phase shifter could not provide a continuous tuning adjustment once over 360 degrees to track leakages without resetting, which increase processing complexity and limit the speed of tuning. Also the attenuator may have a fixed set of tuning range, thus limit the tuning resolutions.

The inventions described below are a comprehensive approach to increase RFID reading distance by reducing reader transmission leakage and receiving noise figure, improving polarization matching between reader and tag antennas, and increase tag back-scattering modulation efficiency. With long range RFID reader and tags, a new apparatus of applying the RFID readers and tags for electronic positioning and guidance purpose is to be disclosed below. The new positioning system has a much shorter propagation delay and processing time than satellite positioning system. It is also suitable for indoor or outdoor environment.

FIG. 1 illustrates a diagram of a radio-frequency identification (RFID) positioning system 100. In the radio-frequency identification (RFID) positioning system 100, a RFID reader 105 with a direction-finding phased-array antenna is used to read a first RFID tag 135, a second RF tag 140 and a third RF tag 145 in its interrogation zone. The angle of arrival information of each tag is obtained using the electronically controlled phased array. Three RFID tags, whose coordinates are stored in their memory, are used as position markers for the RFID reader 105. The RFID reader 105 shall interrogate these tags to obtain their coordinates and subsequently calculated the reader's own coordinates and orientation.

In one embodiment of the techniques provided, the RF reader 105 could couple to a first directional antenna 120, a second directional antenna 125 and a third directional antenna 130. The RF reader 105 could couple the first directional antenna 120 through transmitting (TX) signal 111 and receiving signal (RX) 112. In another embodiment, the RF reader 105 could couple the second directional antenna 125 through TX signal 113 and receiving signal (RX) 114. In another embodiment, the RF reader 105 could couple the third directional antenna 130 through transmitting (TX) signal 115 and receiving signal (RX) 116.

In one embodiment, the phased-array antenna in the RF reader 105 contains at least two radiating elements, and each radiating element is driven by a dedicated radio frequency (RF) up-converter for transmission and RF down-converter for reception. The phase delays between adjacent radiating elements are electronically controlled to create radiation peaks at different azimuth or elevation angles to estimate the direction of tag being interrogated.

The reader 105 position and orientation can be determined using the triangulation principle. Two out of three RFID tags (135, 140 and 145) are sufficient for the reader 105 to determine its longitude, latitude and orientation for a reader with a 1-D phased-array, if the reader and three tags (135, 140 and 145) are not located on a straight line. Also a 2-D phased-array with azimuth and elevation beam control is necessary for the extraction of the 3-D reader coordinates and orientation. The track of reader 105 may be obtained by continuously monitoring its position, and its moving speed may be calculated accordingly.

The RFID tags (135, 140 and 145) may store additional information such as speed limit and road condition. This information may be further process by the processor or host of the RFID reader for guidance purpose. In one embodiment, a wired programmer 150 may be directly connected to the tag to update its memory on demand. In another embodiment, the RFID tags may also be wirelessly programmed by a wireless programmer 160. Real-time update of these tags can be achieved using Internet-connected programmers, such as the wireless programmer 160.

In one embodiment, relative location information of RFID tag 140, RFID tag 135, RFID tag 145, directional antenna 125 and directional antenna 130 can be determined. In one embodiment, distance 177 between RFID tag 135 and RFID tag 140 can be determined. In one embodiment, distance 178 between RFID tag 135 and RFID tag 145 can be determined. In one embodiment, distance 179 between RFID tag 145 and RFID tag 140 can be determined. In one embodiment, distance 174 between RFID tag 135 and directional antenna 125 can be determined. In one embodiment, distance 175 between RFID tag 140 and directional antenna 125 can be determined. In one embodiment, distance 176 between RFID tag 145 and directional antenna 125 can be determined. In one embodiment, angle 171 between RFID tag 135 and directional antenna 125 can be determined. In one embodiment, angle 172 between RFID tag 140 and directional antenna 125 can be determined. In one embodiment, angle 173 between RFID tag 145 and directional antenna 125 can be determined.

FIG. 2A illustrates a diagram of RFID reader structures with in-reader and in-antenna transmission leakage cancellers. In one embodiment, a RFID reader 200 comprises a digital processor 201 that includes memory 202. The digital processor 201 can pass information to a host controller 207, a key pad 208 and a display 209.

In one embodiment, digital processor 201 pass signals to DAC (Digital-to-Analog Converter) 203. The DAC 203 can output baseband (BB) transmitting signals 205. Receiving signals 206 can be passed into ADC (Analog-to-Digital-Converter) 204 and then the output of the ADC 204 can be passed into digital process 201 for demodulation and decoding. These baseband TX signals are used to modulate the local oscillator (LO) reference signal to generate the RF TX signal. In one embodiment, the RFID reader 200 contains a phase lock loop (PLL) oscillator 213 for LO signal generation. In a phased array, the local oscillator signals are shared among all radiating elements. The RF receiving signal is amplified by a low noise amplifier 224, and down-converted by the quadrature down-mixer 212 to generate baseband RX signals 217. In some embodiments, the baseband RX BB signals are same signals as 206. A memory circuit 202 is connected to digital processor for the storage of ID contents, control program, and configuration settings. Local operation of the reader without a host is enabled by a keypad 208 and a display 209, both are connected to the digital processor 201. Remote programming of the reader and tags are also supported through a wired or wireless connection from a host controller 207.

In one embodiment, a RFID reader 200 also comprises a quadrature (Quad) Up-Mixer 211 and the quad up-mixer 211 can up-convert the transmitting baseline signal 216.

In one embodiment, a vector modulator 214, a RF power detector 215 are used to mitigate in-reader coupling 218 when are possibility of leakage from TX line to RX line. The RF power detector 231 is placed after the summating directional couplers 222 and 223 on the RX path inside the antenna. The output of this RF detector is the error indicator for the calibration of vector attenuator 214.

In one embodiment, a RFID reader 200 is a bi-static reader that is driven by antennas for Bi-static operation 230 that includes two radiating antenna elements: a transmitting (TX) antenna 250 for transmitting the reader to tag (R2T) interrogation signals and a receiving antenna 255 for receiving the tag to reader (T2R) response signals.

In the bi-static antenna 230, a portion of transmitting (TX) signal is expected to be leaked from the transmit antenna 250 to the receiving (RX) antenna 255 due to near field coupling 251. Farfield reflection of the transmitted signal from the objects near the antennas is another source of leakage.

In one embodiment, inside the RFID reader the proximity of RF transmitting components and transmission lines may also lead to TX coupling to the RF receiving components and transmission lines. Although the coupling due to the receiver and antenna hardware are relatively stable, the near-field coupling and farfield reflections from the objects are neither stable nor predictable. Some existing may use an in-reader canceller to reduce the leakage for the RX mixer. Compensating for the leakage near the antenna would provide a much wider cancellation bandwidth since the phase delay of the leakage and cancellation circuits are reduced. To correct the TX to RX leakage, a portion of TX signal is intentionally introduced to the RX path using two directional couplers 234, 233 and a vector modulator 240 inside the bi-static antenna 230. The name of vector modulator is interchangeable with quadrature up-mixer here. The vector attenuator 240 is adjusted to the value so that the intentionally introduced TX leakage cancels the unintentional TX to RX leakage. An RF power detector 231 is placed after the summating directional coupler on the RX path inside the antenna. The output of this RF detector is the error indicator for the adjustment of vector modulator 214. The circuits to produce the control signals are shown in FIG. 2B.

In another embodiment, an amplifier is used to amplify the signals in RF band to reduce the noise figure of reader. The RX signal to be amplified is first cleaned by the in-reader leakage canceller, which contains two directional couplers, one vector modulator, and one RF power detector. This function of this canceller is to provide to the quadrature down-mixer a low leakage RF signal so that the noise figure of receiver is least. The down-mixer is a non-linear device with lower third order interception (IP3) than passive components. The low noise amplifier is also subject to its own IP3 limit.

In one embodiment, a mono-static antenna 270 is used to transmit R2T and receive T2R signals in the mono-static type of RFID reader. The antenna 270 contains a antenna radiator 263. The antenna radiator 263 transmits and receives signals simultaneously. An antenna duplexer 262 is connected to the antenna radiator. The duplexer 262 has an input port for transmitting and an output port for receiving. In this invention the antenna duplexer 262 is integrated with the antenna, and is preferred to be placed as closed to the antenna radiator 263 as possible. Once again, two couplers 268 and 269, one power detector 260 and one vector modulator 261 are used for leakage cancellations inside the antenna. The two couplers 268 and 269 are preferred to be placed as close to duplexer 262 as possible. A cable 230 is used to connect the reader TX output port to the antenna TX input port 264; and another cable 221 is used to connect the antenna RX output port 265 to the reader RX input port. Unlike other RFID reader system configurations, the arrangement of the canceller and cable in this invention minimize the delay of the antenna-induced leakage. The phase difference between the leakage path and cancellation path is also minimized, thus leads to optimized cancellation bandwidth and depth. The transmitter leakage comes in two ways: one is from the internal circulator, and the other is from the antenna reflection. If the two leakage path may not be minimized, their difference should be minimized. This delay balance is the key contributor of the cancellation bandwidth and depth for both types of leakages.

In one embodiment, the benefits of the distributed leakage cancellation, i.e. using an antenna integrated canceller and a reader integrated canceller, are better receiving noise figure and higher bandwidth. The contribution of this invention is to achieve both benefits at the same time, even for RFID reader systems with antenna cables or antenna switches. A single canceller design could be only be delay matched to either the in-reader leakage or the antenna-induced leakage if antenna cables are used. The cable will produce a frequency dependent phase delay. In multi-antenna RFID reader configuration, the cables could be tens of wavelengths long. A phase error of 10 degree would limit the leakage depth to about 15 dB. Static control of the vector modulator is only able to cancel static transmission leakage. Because transmission leakages changes over time due to equipment temperature variation, cable movement, or environment change, dynamic control of leakage canceller is employed in this invention.

FIG. 2B illustrates a diagram of a feed-forward transmission leakage canceller. In one embodiment, a feed-forward transmission leakage-cancellation circuit 290 may be employed in the antenna or in the reader to address dynamic transmission leakage.

In one embodiment, the feed-forward transmission leakage-cancellation circuit 290 contains five directional couplers. A first coupler 291 and a second coupler 292 are on the TX path 297. A third coupler 293, a fourth coupler 294 and a fifth coupler 295 are on the RX path. The coupler 293 is optional.

In one embodiment, a copy of TX signal 297 is down-mixed with a copy of RX signal 299 in a quadrature down-mixer. The DC-containing outputs of this mixer are low pass filtered by a first low pass filter 283 and a second low pass filter 284 to produce the reference voltages, EVI 285 and EVQ 286. A linear combiner circuit 287 is used to produce two control voltages, CVI 288 and CVQ 289, to drive a quadrature up-mixer 281, whose LO references are taken from the TX path using another directional coupler 294. An optional RF power detector 272 monitors the quality of this canceller during the calibration stage.

In one embodiment, the function of the liner combiner 287 is to product the control voltages CVI 288, CVQ 289 according to the following equation:

$CVI=a*EVI+b*EVQ+c, CVQ=d*EVI+e*EVQ+f,$

Where a, b, c, and d are coefficients to address the dynamic leakages, and c and f are coefficients to address stationary leakages. One configuration of the linear combiner includes four analog multipliers and two analog signal combiners to produce two control signals. Another configuration of the linear combiner includes two analog to digital converters to digitize the reference voltages; a digital signal processor unit to linearly process the converted voltage; and two digital to analog converters to produce two control signals.

In one embodiment, A stationary environment produces stationary control signals, and a varying environment produces a varying control signals. The frequency of the control signal is determined by the relative moving speed of antenna versus the environment. As the environment varies, the two error voltages 285 and 286 also vary. The required control voltages 288 and 289 are automatically generated and self-aligned. The unique benefits of this dynamic canceller are that it is able to cancel the leakage introduced by moving objects without the adjustments of the coefficients of the linear combiner 287. The feed-forward canceller 290 is an open-loop controlled system, therefore a stable control system. The environment tracking speed is limited by the bandwidth of LPF 283 and 284. The bandwidth is only limited by the tag signal bandwidth. In comparison, a feedback-controlled system is potentially unstable, especially at high loop gain. The bandwidth of a feedback-controlled system is additionally affected by the loop gain to avoid loop oscillation.

A slowing varying leakage canceller may be used to cancel in-reader or in-antenna transmission leakages due to temperature changes. By limiting the loop bandwidth, a high cancellation depth is achievable at high loop gain. Such configuration requires highly accurate and monotonically adjustable vector modulators. A few low-cost and simple-structured passive reflective vector modulators are presented below, all of which are contains a 3 dB hybrid coupler and terminations at both hybrid ports. FIG. 3A illustrates a diagram of a reflective vector attenuator with switchable LRC terminations. A reflective vector attenuator 300, comprises a first input/output port 304, a second input/output port 301, a 3 dB hybrid 317 which has a 3 dB port a and a 3 dB port b. The two ports are terminated at least by a first switch-controlled resistor 311, a first switch-controlled capacitor 309, a first switch-controlled inductor 310, a first short circuit termination 312, a second switch-controlled resistor 315, a second switch-controlled capacitor 313, a second switch-controlled inductor 314 and a second short circuit termination 316. The intended termination impedances at each port is 0, j50, −j0.02, 50 or infinity ohms. The transmission coefficient T 305 and the reflection coefficient Γ 306 of the RVA are defined as follows:

$$T = -\frac{j}{2}(\Gamma_a + \Gamma_b), \Gamma = \frac{1}{2}(\Gamma_a + e^{2j*c}\Gamma_b),$$

where Γa 307 and Γb 308 are the reflection coefficients of the two terminations at the hybrid ports, and c is the hybrid phase difference. Therefore, the magnitude and phase of the transmission coefficient of this RVA can be adjusted by the independent control of two termination impedances. The reflective vector attenuator in FIG. 3A allows for discrete adjustment of their transmission and reflection coefficients.

FIG. 3B illustrates a diagram of a reflective vector attenuator with shunt-switch-loaded transmission lines. In one embodiment, a reflective vector attenuator 319, comprises a 3 dB hybrid 329, a first distributed termination and a second distributed termination. The first distributed termination comprises a first quarter-wavelength transmission line, a first 50-ohm end termination 322, and multiple switch-enabled short circuit shunt terminations 323,324 and 325. The second distributed termination comprises a second quarter-wavelength transmission line, a second 50-ohm end termination 321, and multiple switch-enabled short circuit shunt terminations 326, 327 and 328. The equivalent termination impedance for each port is 0, 50, j50, and infinity ohms. The reflective vector attenuator in FIG. 3B allows for discrete adjustment of their transmission and reflection coefficients.

FIG. 3C illustrates a diagram of a reflective vector attenuator (RVA) with series and shunt tunable LRC terminations. In one embodiment, a reflective vector attenuator 339 comprises a first tunable LRC terminator and a second tunable LRC terminator. The first tunable LRC terminator contains a tunable resistor 331, a tunable capacitor 333, and an inductor 332. The second tunable LRC terminator contains a tunable resistor 336, a tunable capacitor 334, and an inductor 335. Maximum reflection tuning range may be obtained if the inductor and capacitor values are selected to resonant. The first tunable LRC terminator is in series configuration and the second tunable LRC terminator is in parallel configuration. At the resonant frequency the terminator impedance is equal to the resistance. The adjustments of capacitors introduce orthogonal movements of the reflection coefficients on the smith chart for the different terminators. Therefore, this RVA provides continuous phase and magnitude adjustments to its transmission and reflection coefficients. It is also possible to use only two tunable components to produce a small tuning-range vector attenuator.

FIG. 3D illustrates a diagram of a reflective vector attenuator (RVA) with a double variable-resistor-loaded transmission line. In one embodiment, a reflective vector attenuator 349, comprises a fixed termination and an adjustable termination. The adjustable termination comprises two adjustable resistors 341 and 343 separated by a one-eighth wavelength transmission line 345. Both tunable resistor are in shunt connection to the shared ground 342 and 344. The fixed termination comprises a fixed impedance 346 at any value connected shunt to ground 347. The tuning of the resistors 341 and 343 induces orthogonal adjustment of the RF transmission coefficent of the vector attenuator. Continuous and monotonic adjustment of the transmission coefficient can be achieved by using continuously and monotonically adjustable resistors. This RVA requires only two tunable resistors for the adjustments of the transmission and reflection coefficients for the vector attenuator.

FIG. 3E illustrates a diagram of a reflective vector attenuator (RVA) with phase-delayed variable resistors. In one embodiment, a reflective vector attenuator 319 comprises two tunable terminations. The first adjustable terminator comprises a field effect transistor (FET) 354 coupled to a terminal 355. The field effective transistor 354 acts as a tunable resistor. The second adjustable terminator comprises a one-eighth wavelength transmission line 351 loaded by another FET 352 coupled to another terminal 353. The FET 352 also acts as a tunable resistor. This RVA has a full magnitude and phase tuning range. In one embodiment, the first FET 354 and the one-eighth wavelength transmission line 351 are coupled to a 3 dB hybrid 350.

The choice of tunable resistors for any RVA includes, but not limited to, FET, pi-n diode, or resistor networks controlled by RF switches. The choice of tunable capacitor includes, but not limited to, varactor or capacitor networks controlled by RF switches. Any of these analog tunable components may be adjusted digitally by the controlling processor with the help of DAC.

FIG. 3F illustrates a diagram of a phase delay circuit to replace ⅛ wavelength transmission line. In one embodiment, a phase delay circuit 360 comprises a series inductor 361 and a shunt capacitor 362. One end of the capacitor 362 is connected to the inductor 361, and the other end is connected to ground 363. RF signals can pass back and forth from one end of the inductor 361 to another end of the inductor 361.

FIG. 3G illustrates a diagram of a circuit to replace ⅛ wavelength transmission line with negative delay. In one embodiment, a phase delay circuit 370 comprises a series capacitor 371 and a shunt inductor 372. One end of the inductor 372 is connected to the capacitor 371, and the other end is connected to ground 373. Likewise, RF signals can pass back and forth from one end of the capacitor 371 to another end of the capacitor 371. In one embodiment, a phase delay circuit 370 comprises a capacitor 371, an inductor 372 coupled to both the capacitor 371 and a terminal 373. The transmitting signal can pass from one end of the capacitor 371 to another end of the capacitor 371.

The benefits of the reflective vectors attenuators shown from FIG. 3A to FIG. 3G which is made of a 90 degree hybrid, two differential multipliers, and an in-phase power combiner, are the cost saving, power saving compared to a traditional vector amplifier. Another common vector attenuator structure includes a 360 degree phase shifter and a three resistor attenuator. The benefits of the reflective vectors attenuators in FIG. 3A through FIG. 3G over the phase shifter and attenuator approach are the cost saving and reliability improvement. The simple structure of the proposed reflective vector attenuators shall have better reliability due to the low counts of passive components and absence of active amplifiers.

The RF transfer between a radio transmitter and a radio receiver depends heavily on the polarization match of their antennas. Polarization adjustment on either the reader or tag side may be used to enhance or reduce the radio power transfer in the radio link. FIG. 4A illustrates a diagram of a dual adjustable polarized antenna with controllable polarization correlations. In one embodiment, a dual adjustable polarized antenna 400 comprises a 3 dB hybrid 430, a first RVA 405, a second RVA 410, and a radiating structure 401. The radiating structure 401 comprises a first cross-polarized antenna radiating element 402 and a second cross-polarized antenna radiating element 403.

The choice of cross-polarized radiating elements includes, but not limited to, two dipoles or two monopoles in orthogonal placements; a circular, a square, an annular, a "+" shaped or any other symmetrical printed patches over a ground plane with orthogonal excitations. The excited wave polarizations from the first cross-polarized antenna radiating element 402 and the second cross-polarized antenna radiating element 403 are orthogonal. Here one signal polarization is denoted as the CO-POL and the other is denoted as X-POL. The two RVA are used to phase shift or attenuate the CO-POL and X-POL signals independently. The 3 dB hybrid 430, together with the two RVA, transforms the CO-POL and X-POL antenna inputs 420 and 425 into two new signals. The new signals exhibit new polarization forms that are different from the intrinsic polarizations of the radiating elements. For example, a dual circular polarized reception may be formed using dual linear polarized radiating elements. In this case, the axial ratios of the new polarizations are determined by the RVA phase shifts and the starting polarizations. The 3 dB hybrid 430 may be a 90 degree hybrid when quadrature combinations of antenna signals are desired, or a 180 degree hybrid when inphase and out-of-phase combinations of antenna signals are desired.

The attenuation ratio of the two RVA may be adjusted to affect the polarization correlation of the two new virtual polarization forms. For example, when the X-POL RVA is set to total absorption mode and the CO-POL RVA is set to phase shifting mode, both antenna input ports will have the CO-POL polarization, and their polarization correlation is 100%. When the CO-POL RVA is set to total absorption mode and the X-POL RVA is set to phase shifting mode, both antenna input ports will have X-POL polarization with 100% polarization correlation. When both RVA are set to phase shifting mode and their attenuation are equal, the two new output polarizations will be orthogonal and their polarization correlation is 0. When this adjustable polarization antenna is used with a RFID reader, the polarizations of the antennas may be changed on demand based on the number of antennas on each tag. RFID tags with one antenna are best interrogated with a pair of polarization correlated antennas, and RFID tags with dual polarized antenna are best interrogated with orthogonally polarized antennas. The distinctive benefits of the proposed polarization tuner are simple structure, cost saving, simultaneous control of polarization axial ratios and tile angles, and the control of orthogonality of the two polarizations.

FIG. 4B illustrates a diagram of a polarization adjustable antenna with matching circuits. In one embodiment, a single-feed polarization adjustable antenna 450 can be developed for the mono-static RFID readers. The single-feed polarization adjustable antenna 450 contains a dual-polarized patch 461. The dual-polarized patch 461 has at least one radiating element capable of supporting orthogonal resonant modes, a first RVA 453, a second RVA 454, and a power combiner 452. In one embodiment, the power combiner 452 comprises at least one switchable matching circuit to match the impedances of the combiner 452. The power combiner 452 receives input signal 451. The first RVA 453 feeds signals 456 to Co-POL 459. The second RVA 454 feeds signals 455 to X-POL 460. The operation of the first RVA 453 and the second RVA 454 is illustrated in the following examples. If the patch 461 provides signals from vertical polarized CO-POL 459 and horizontal polarized X-POL 460, the 45 degree linear polarized reception would require equal amount of signal from the CO-POL 459 and X-POL 460 radiating elements, and the horizontal polarized reception would require all signal power from the X-POL 460 radiating elements. The CO-POL RVA should be set to the no-loss-phase-shifting mode for the former case and to the no-loss-all-reflection mode for the latter case. The input impedance for the former is 50 ohm, and the input impedance could be zero, infinity, j50 ohm, −j0.02 or any other point on the unity reflection coefficient circle on the Smith chart. A circularly polarized reception may be obtained by the quadrature combing of signals from CO-POL 459 and X-POL 460.

FIG. 4C illustrates a diagram of a stubbed matching circuit for a 25/50 ohm variable load. In one embodiment, the impedance matching circuit 470 developed to match RVA for the single-feed tunable polarization antenna. This impedance matching circuit 470 comprises a three-connection Tee 473, a 50-ohm one-tenth-wavelength transmission line 474 coupled to the three-connection Tee 473, a matching capacitor 476 and a switch 475. The three connection Tee 473 is also coupled to Co-POL RVA 471 and X-POL RVA 472. The switch 475 is coupled to the 50-ohm one-tenth-wavelength transmission line 474 in one end, and is coupled to the matching capacitor 476 in the other end. The match capacitor 476 is coupled to a terminal 477.

The targeted input impedance at the three-connection Tee is 50 ohms and 25 ohms. When equal percentage combination of CO-POL and X-POL are required, 25-ohm equivalent impedance is presented at the Tee. When total transmission is required for CO-POL, the X-POL RVA is set to a total reflection state with infinity impedance. The equivalent impedance of the Tee becomes 50 ohm.

FIG. 4D illustrates a diagram of a branch selective matching circuit for a 25/50 ohm variable load. In one embodiment, the impedance matching circuit 480 contains a three connection Tee 483, a first single pole double throw (SPDT) switches 484, a second single pole double throw (SPDT) switch 487, an arbitrary length 50-ohm transmission line 485, and a quarter-wavelength 35-ohm transmission line 486. The three connection Tee 483 is also coupled to Co-POL RVA 481 and X-POL RVA 482. The two targeted impedances for matching at the Tee 483 is also 50 ohms and 25 ohms. The 35-ohm transmission line 486 may be selected by the two switches 484 and 487 to match the 25-ohm equivalent impedance to 50 ohms. The output passed to transceiver signal 488 through the switch 487. The TX leakage of a mono-static reader is heavily affected by the reader and antenna impedance mismatch. These two types of power combiner and matching provide matched antenna impedance to mono-static reader without any termination loss.

Amplified back-scattering modulated RFID tag systems have a higher tag response signal to boost the reader range. FIG. 5A illustrates a diagram of a bi-static RFID tag with amplifier and modulator. In one embodiment, a semi-active RFID tag 500 is develop for longer reader range than passive antennas with a back-scattering modulation efficiency greater than unity. This tag 500 contains a receiving antenna 501, an RF amplifier 502, an envelope detector 503, an spst switch 508, a transmitting antenna 509, a memory unit 511, a micro-processor 510, and a battery 512. In one embodiment, during the TX mode, external R2T signals are received by the CO-POL antenna 501 and directed to the RF amplifier 502. The amplified signal is demodulated by an envelope detector 503, which is made of a diode 504 and a low pass RC filter that comprises a resistor 506, a capacitor 505 and a terminal 507. The demodulated R2T signal is processed by the microprocessor 510 to initiate further operations such as reading or writing memory to the memory unit 511, controlling the modulator 508, or communicating to a remote host 516, a keypad 517 or a display 518. During the transmitting mode, the modulation of T2R signal is commanded by the micro-processor 510 through the spst switch. The modulated signal is then sent to a transmitting antenna 509 to broadcast the T2R message. A battery 512 is used as the primary power source to operate the processor 510 and the amplifier 502. A remote host 516 may be connected to the tag, and the tag may be alternatively power by the interface connection.

In some embodiment, the receiving and transmitting antennas have orthogonal polarizations. The RX antenna polarization here is designated as CO-POL, and TX antenna polarization is designated as X-POL. A low coupling ratio is expected between the two antennas since the field orientations are expected to be orthogonal and not correlated. As the RFID tags are usually attached to objects, the mutual coupling to the object will degrade the isolation between the two antennas. If the loop gain reach unity and amplifier start to oscillate, full RF power is generated and the envelop detector 503 is configured to detect the state of oscillation.

To suppress the oscillation, the gain of amplifier 502 can be reduced by the micro-processor 510 upon the detection of strong RF signal at the RF power detector 503. If an abnormal amplitude is detector at the envelop detector 503, the micro-processor 510 could reduce the amplifier gain. This automatic gain adjustment mechanism not only suppresses internal oscillation, but also keeps the reader operating in the linear mode when a strong reader signal arrived at the tag RX antenna. Exiting tag may utilize a circulator to duplex the antenna for transmission and reception. That type of tag has a higher instability since the reflection coefficient of an antenna is generally higher than the coupling between a pair of cross-polarize antennas when detuned.

FIG. 5B illustrates a diagram of a Bi-static RFID tag with amplifier modulator and leakage canceller for stability control and modulation. In one embodiment, a second semi-active RFID tag 520 comprises a CO-POL receiving antenna 526, a RVA 521, a second directional coupler 528, a X-POL antenna 531, an RF amplifier 522, an spst switch 523, a power supply 524, an RF detector 529.

In one embodiment, In this RFID tag 520, a portion of receiving R2T signal is directed to the RVA 521, and the subsequent phase and amplitude adjusted R2T signal is added back to the amplified T2R signal before RF detection. One method to modulate the R2T signal is by either supply or not supply DC power 524 to the amplifier through the SPST switch 523. Because a portion of transmit signal is coupled back to the receiving antenna to cancel the coupling between two antennas. The following RF detector 529 produces an error signal to indicate the quality of cancellation for the micro-processor. The antenna stability is improved since the leakage-induced loop gain is reduced. Therefore, the gain of amplifier 522 does not need to be sacrificed for stability.

An amplifier often allows different forwarding gain at different supply voltages. By varying the forward gain of amplifier 522, the transmitting power is then amplitude modulated. Therefore, this tag may be configured to produce back-scattering modulated signal of narrower bandwidth than on-off keying modulated signals at the same data rate. Another method to modulate the R2T signal is to apply phase modulation or frequency modulation by controlling the phase shift of the RVA. Therefore, the re-transmitted signal may be phase modulated or frequency modulated. Additionally, an switch 523 is connected to the bias of amplifier to toggle between two gain stages to perform deep On/off modulation.

A portion of transmitter characteristic may be transferred to a remote host of the tags 520. Each transmitter may have its own identification number, and this number may be transferred to the tag host along with the time of interrogation. Therefore, additional services may be enabled. One application is to have the tags installed at a gate, and upon the reading of tag, the reader identification may be sent to the host of tag to operate the gate, or to track the path of the reader.

The circuits shown in FIG. 5A and FIG. 5B enables complex modulation of the received RF signal. By adjusting the vector attenuator 521, it is possible to change the modulus of the reflection coefficient, therefore to amplitude modulate the back-scattered signal at the receiving antenna. The transmission coefficient may also be adjusted in the same fashion, therefore to amplitude modulate the re-transmitting signal for the transmitting antenna. The vector phase shifter 521 may be adjusted quadraturely to apply phase shift to the reflection coefficient for the receiving antenna. Therefore, phase modulated back-scattered signal may be obtained at the receiving antenna. Frequency modulated back-scattered signal may also be obtained by continuously modulating the RVA with two sinusoidal signals, where one sinusoidal signal is a phase shifted version of the other signal. In the same fashion, the re-transmitting signal at the transmitting antenna may also be phase shifted or frequency modulated, using a different set of coefficients as the RVA control signals.

FIG. 5C illustrates a diagram of a Bi-static RFID tag with polarization control to provide a means to tune the tag polarization. The polarization In one embodiment, a bi-static RFID tag comprises a dual polarization tuner 540, a CO-POL Receiving Antenna 543 coupled to the tuner 540, a X-POL Receiving Antenna 544 coupled to the tuner 540, an amplifier 542 coupled to the tuner 540, a RF detector 541, a modulation control 547 by a switch 548, a power supply 546. One method to construct the polarization tuner 540 is previously shown in FIG. 4A. There are external polarization control 549 feeds into the dual polarization tuner 540. In another embodiment, the external polarization control 549 is controlled by a micro-processor. In one embodiment, the RF detector 541 has a baseband output signal 545. In some embodiments, the polarization control can enhance tag stability by reducing antenna coupling, and improve reception sensitivity by matching the tag antenna polarization to the multi-path combined wave.

The circuits 500, 520 and 550 may also be used to construct a radio relay to improve RFID read range. Similar to the disclosed semi-active RFID tag, the function of relay is to re-transmit the received RF wave at a higher amplitude. Therefore, FIG. 5A, FIG. 5B or FIG. 5C may be may be understood as the representative of a relay. A relay is placed between a RFID reader and a RFID tag. In one configuration, the relay may be used to enhance the reader to tag channel, so the relay RX antenna 501 may be pointed towards a reader, and relay TX antenna 509 may be pointed towards a tag. In another configuration, the relay may be used to enhance the tag to reader channel, so the relay RX antenna 501 may be pointed toward a tag, and relay TX antenna 509 may be pointed towards a reader. A relay does not re-modulate received RF waves, so the on/off modulator switches 508, 523 and 548 may be removed from the circuits. Because of the internal amplifier 502 and antenna couplings, the relay is subject to oscillation under circumstances. Stability monitoring is performed by the power detector 503, 529 or 571. Stability control is performed by the adjusting the RVA 521 or 571. Tuning of the antenna polarization by adjusting the polarization tuner 540 is another benefit since the same multipath effect also applies to the reader to relay communication link and relay to tag communication link.

Another method to construct the variable gain amplifier 502 is shown in FIG. 5D. This variable gain amplifier 570 comprises a RVA 571, and an amplifier 572. The RVA 571 may be connected to the either the input or the output of the amplifier 572. This variable amplifier is functionally equivalent of a vector modulator, or vector amplifier. This variable amplifier may have a variable gain, and a variable phase.

The invention claimed is:

1. A radio-frequency identification positioning system, comprising:
   a radio-frequency identification reader; and
   a phased-array antenna coupled to the radio-frequency identification reader, wherein the phased-array antenna is configured to obtain angle of arrival information and location information of at least two radio-frequency identification tags, wherein the at least two radio-frequency identification tags are configured to store the location information, wherein the phased-array antenna is configured to contain at least two radiating elements, wherein each of the at least two radiating elements is driven by a dedicated radio frequency up-converter for transmission, wherein each of the at least two radiating elements is driven by a dedicated radio frequency down-converter for reception, wherein phase delays between the at least two radiating elements are configured to create radiation peaks at different azimuth or elevation angles to estimate direction of the at least two radio-frequency identification tags, wherein position and orientation of the reader is determined by using triangulation principle on information of the direction of the at least two radio-frequency identification tags.

2. The radio-frequency identification positioning system of claim 1, wherein the radio-frequency identification tag is programmed to store road condition including but not limited to road access, speed limit, height limit, or weight limit.

3. The radio-frequency identification positioning system of claim 1, wherein the radio-frequency identification reader comprises a digital processor and a memory unit, wherein the radio-frequency identification reader further comprises a digital-to-analog converter and a analog-to-digital converter.

4. The radio-frequency identification positioning system of claim 1, wherein the radio-frequency identification reader is configured to have at least two radio wave polarizations.

5. A radio frequency identification tag, comprising:
a receiving antenna, wherein the receiving antenna is configured to receive external signals;
an amplifier coupled to the receiving antenna, wherein the amplifier is configured to amplify the external signals and generate amplified signals;
an envelope detector coupled to the amplifier, wherein the envelop detector is configured to demodulate the amplified signals from the amplifier and generate demodulated signals;
a processor coupled to the envelop detector, wherein the processor is configured to process the demodulated signals to initiate activities including but not limiting to reading or writing memory, generate processed signals;
a single-pole-single-throw switch coupled to the amplifier and the processor, wherein the switch is controlled by the processor to amplitude-modulate, phase modulate, or frequency-modulate the amplified signal to generate modulated messages;
a transmitting antenna coupled to the switch, wherein the transmitting antenna is configured to broadcast the modulated messages, and
a memory unit coupled to the processor, wherein the memory unit is configured to store information.

6. The radio frequency identification tag of claim 5, wherein the transmitting and receiving antennas are cross-polarized.

7. The radio frequency identification tag of claim 5, further comprising a dual polarized antenna with two ports, wherein the dual polarized antenna is tunable.

8. The radio frequency identification tag of claim 5, wherein the amplifier is powered by a battery.

9. The radio frequency identification tag of claim 8, wherein the battery is replaced by a capacitor.

10. The radio frequency identification tag of claim 5, wherein the amplifier is powered by a remote host.

11. The radio frequency identification tag of claim 5, wherein the gain of amplifier is adjustable.

12. The radio frequency identification tag of claim 5, further comprising:
a vector attenuator, wherein the vector attenuator is placed in series or parallel with the amplifier to change the propagating delay from the receiving antenna to the transmitting antenna.

13. The radio frequency identification tag of claim 5, further comprising:
a polarization turner coupled to the amplifier, the transmitting antenna and the receiving antenna, wherein the polarization turner is configured to adjust the transmitting and receiving polarization states to improve tag stability and reception.

14. The radio frequency identification tag of claim 5, further comprising a keypad, wherein the keypad is a physical keypad or a virtual keypad.

15. radio frequency identification tag of claim 5, further comprising a display unit.

16. The radio frequency identification tag of claim 5, wherein the amplifier is configured to on/off modulate the amplified signal by turning on or off the amplifier power supply.

17. A radio-frequency identification positioning system, comprising:
a radio-frequency identification reader; and
a phased-array antenna coupled to the radio-frequency identification reader, wherein the phased-array antenna is configured to obtain angle of arrival information and location information of at least two radio-frequency identification tags, wherein the at least two radio-frequency identification tags are configured to store the location information, wherein the phased-array antenna is configured to contain at least two radiating elements, wherein each of the at least two radiating elements is driven by a dedicated radio frequency up-converter for transmission, wherein each of the at least two radiating elements is driven by a dedicated radio frequency down-converter for reception, wherein phase delays between the at least two radiating elements are configured to create radiation peaks at different azimuth or elevation angles to estimate direction of the at least two radio-frequency identification tags, wherein position and orientation of the reader is determined by using triangulation principle on information of the direction of the at least two radio-frequency identification tags, wherein the radio-frequency identification reader comprises a digital processor and a memory unit, wherein the radio-frequency identification reader further comprises a digital-to-analog converter and an analog-to-digital converter.

18. The radio-frequency identification positioning system of claim 17, wherein the radio-frequency identification reader is configured to have two wave polarizations.

19. The radio-frequency identification positioning system of claim 17, wherein the radio-frequency identification tag is programmed to store road condition information including road access, speed limit, height limit, or weight limit.

* * * * *